(12) United States Patent
Ahn et al.

(10) Patent No.: US 9,666,558 B2
(45) Date of Patent: May 30, 2017

(54) SUBSTRATE FOR MOUNTING A CHIP AND CHIP PACKAGE USING THE SUBSTRATE

(71) Applicant: POINT ENGINEERING CO., LTD., Asan-si (KR)

(72) Inventors: Bum Mo Ahn, Yongin-si (KR); Ki Myung Nam, Cheonan-si (KR); Seung Ho Park, Hwaseong-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 14/753,807

(22) Filed: Jun. 29, 2015

(65) Prior Publication Data

US 2016/0379957 A1    Dec. 29, 2016

(51) Int. Cl.
*H01L 25/065* (2006.01)
*H01L 23/498* (2006.01)

(52) U.S. Cl.
CPC ...... *H01L 25/065* (2013.01); *H01L 23/49811* (2013.01); *H01L 23/49838* (2013.01);
(Continued)

(58) Field of Classification Search
CPC ............ H01L 25/065; H01L 23/49811; H01L 23/49838; H01L 2224/10; H01L 24/10; H01L 2224/1405; H01L 2224/141; H01L 2224/1605; H01L 2224/161; H01L 2224/2505; H01L 2224/251; H01L 2224/2901; H01L 2224/2902; H01L 2224/3005; H01L 2224/301; H01L 2224/3205; H01L 2224/321; H01L 2224/3305; H01L 2224/331; H01L 2224/4005; H01L 2224/401;
(Continued)

(56) References Cited

U.S. PATENT DOCUMENTS

| 3,621,550 A | 11/1971 | Colestock |
| 4,685,706 A | 8/1987 | Kowal et al. |

(Continued)

FOREIGN PATENT DOCUMENTS

| CN | 101312185 A | 11/2008 |
| DE | 10056776 A1 | 10/2001 |

(Continued)

OTHER PUBLICATIONS

Korean Intellectual Property Office Office Action—Notification of Grounds for Rejection for Application No. 10-2014-0057317, dated Apr. 17, 2015, 4 pages.

(Continued)

*Primary Examiner* — Walter H Swanson
(74) *Attorney, Agent, or Firm* — Sunstein Kann Murphy & Timbers LLP

(57) ABSTRACT

Disclosed is a chip-mounting substrate. The chip-mounting substrate includes a plurality of conductive portions configured to apply voltages to at least two or more chips to be mounted, a plurality of insulation portions formed between the conductive portions and configured to electrically isolate the conductive portions, and a cavity formed in a region which includes at least three or more of the conductive portions and at least two or more of the insulation portions and depressed inward to form a space in which the chips are mounted.

12 Claims, 5 Drawing Sheets

(52) U.S. Cl.
CPC .............. *H01L 2225/06517* (2013.01); *H01L 2225/06524* (2013.01)

(58) Field of Classification Search
CPC ..... H01L 2224/4501; H01L 2224/4502; H01L 2224/4805; H01L 2224/481
USPC ................................................. 257/737, 773
See application file for complete search history.

(56) References Cited

U.S. PATENT DOCUMENTS

| | | |
|---|---|---|
| 4,722,914 A | 2/1988 | Drye et al. |
| 5,344,795 A | 9/1994 | Hashemi et al. |
| 5,729,432 A | 3/1998 | Shim et al. |
| 5,844,286 A | 12/1998 | Hase |
| 6,054,780 A | 4/2000 | Haigh et al. |
| 6,087,882 A | 7/2000 | Chen et al. |
| 6,118,357 A | 9/2000 | Tomasevic et al. |
| 6,239,496 B1 | 5/2001 | Asada |
| 6,271,801 B2 | 8/2001 | Tuttle et al. |
| 6,303,011 B1 | 10/2001 | Gao et al. |
| 6,309,912 B1 | 10/2001 | Chiou et al. |
| 6,330,741 B1 | 12/2001 | Wright et al. |
| 6,429,043 B1 | 8/2002 | Nakazawa et al. |
| 6,528,351 B1 | 3/2003 | Nathan et al. |
| 6,593,662 B1 | 7/2003 | Pu et al. |
| 6,599,768 B1 | 7/2003 | Chen |
| 6,639,324 B1 | 10/2003 | Chien |
| 6,740,903 B2 | 5/2004 | Isoda |
| 6,777,659 B1 | 8/2004 | Schwarte |
| 6,784,023 B2 | 8/2004 | Ball |
| 6,844,606 B2 | 1/2005 | Logsdon et al. |
| 6,913,949 B2 | 7/2005 | Pflughaupt et al. |
| 6,917,089 B2 | 7/2005 | Schuurmans et al. |
| 6,928,726 B2 | 8/2005 | Zollo et al. |
| 6,987,661 B1 | 1/2006 | Huemoeller et al. |
| 7,002,254 B2 | 2/2006 | Harper et al. |
| 7,075,329 B2 | 7/2006 | Chen et al. |
| 7,112,885 B2 | 9/2006 | Chen et al. |
| 7,134,193 B2 | 11/2006 | Sasaoka et al. |
| 7,183,643 B2 | 2/2007 | Gibson et al. |
| 7,196,426 B2 | 3/2007 | Nakamura et al. |
| 7,198,986 B2 | 4/2007 | Sunohara |
| 7,214,565 B2 | 5/2007 | Sunohara |
| 7,217,888 B2 | 5/2007 | Sunohara et al. |
| 7,230,318 B2 | 6/2007 | Kripesh et al. |
| 7,242,089 B2 | 7/2007 | Minervini |
| 7,242,591 B2 | 7/2007 | Imamura et al. |
| 7,251,391 B2 | 7/2007 | Murayama |
| 7,286,366 B2 | 10/2007 | Zollo et al. |
| 7,288,433 B2 | 10/2007 | Haba et al. |
| 7,312,536 B2 | 12/2007 | Yamano et al. |
| 7,319,049 B2 | 1/2008 | Oi et al. |
| 7,319,598 B2 | 1/2008 | Steiner et al. |
| 7,325,301 B2 | 2/2008 | Miura |
| 7,326,932 B2 | 2/2008 | Hynes et al. |
| 7,335,531 B2 | 2/2008 | Iijima et al. |
| 7,340,121 B2 | 3/2008 | Yonekura et al. |
| 7,426,868 B2 | 9/2008 | Fessele et al. |
| 7,517,712 B2 | 4/2009 | Stark |
| 7,551,454 B2 | 6/2009 | Wuchse et al. |
| 7,692,444 B2 | 4/2010 | Chen et al. |
| 7,697,301 B2 | 4/2010 | Lee et al. |
| 7,834,438 B2 | 11/2010 | Shiraishi et al. |
| 7,872,418 B2 | 1/2011 | Hata et al. |
| 7,901,989 B2 | 3/2011 | Haba et al. |
| 7,902,843 B2 | 3/2011 | Fang et al. |
| 8,018,032 B2 | 9/2011 | Lu |
| 8,154,031 B2 | 4/2012 | Grotsch et al. |
| 8,351,634 B2 | 1/2013 | Khenkin |
| 8,390,083 B2 | 3/2013 | O'Donnell et al. |
| 8,415,704 B2 | 4/2013 | Ivanov et al. |
| 8,513,789 B2 | 8/2013 | Haba et al. |
| 8,779,532 B2 | 7/2014 | O'Donnell et al. |
| 8,921,879 B2 | 12/2014 | Nam et al. ...................... 257/98 |
| 2003/0059976 A1 | 3/2003 | Nathan et al. |
| 2003/0193083 A1 | 10/2003 | Isoda |
| 2003/0193088 A1 | 10/2003 | Hall et al. |
| 2004/0016995 A1 | 1/2004 | Kuo et al. |
| 2004/0135952 A1 | 7/2004 | Kurashina et al. |
| 2004/0195581 A1 | 10/2004 | Isoda |
| 2005/0046011 A1 | 3/2005 | Chen et al. |
| 2005/0046041 A1 | 3/2005 | Tsai |
| 2005/0087356 A1 | 4/2005 | Forcier |
| 2005/0176209 A1 | 8/2005 | Jorgenson et al. |
| 2006/0033112 A1 | 2/2006 | Isoda |
| 2006/0215379 A1 | 9/2006 | Zollo et al. |
| 2006/0246617 A1 | 11/2006 | Lee et al. |
| 2006/0246630 A1 | 11/2006 | Sunohara et al. |
| 2006/0258053 A1 | 11/2006 | Lee et al. |
| 2006/0283627 A1 | 12/2006 | Chen et al. |
| 2007/0029654 A1 | 2/2007 | Sunohara et al. |
| 2007/0126102 A1 | 6/2007 | Mohammed et al. |
| 2007/0128754 A1 | 6/2007 | Fuergut et al. |
| 2007/0131349 A1 | 6/2007 | Tuominen et al. |
| 2007/0132536 A1 | 6/2007 | Lee et al. |
| 2007/0143991 A1 | 6/2007 | Bauer et al. |
| 2007/0158822 A1 | 7/2007 | Fujii |
| 2007/0177360 A1 | 8/2007 | Shiraishi et al. |
| 2007/0181988 A1 | 8/2007 | Han et al. |
| 2007/0187826 A1 | 8/2007 | Shim et al. |
| 2007/0190686 A1 | 8/2007 | Wang |
| 2007/0241451 A1 | 10/2007 | Koizumi et al. |
| 2007/0290329 A1 | 12/2007 | Murayama et al. |
| 2008/0029879 A1 | 2/2008 | Tuckerman et al. |
| 2008/0040921 A1 | 2/2008 | Zollo et al. |
| 2008/0044127 A1 | 2/2008 | Leising et al. |
| 2008/0050847 A1 | 2/2008 | Gluschenkov et al. |
| 2008/0054486 A1 | 3/2008 | Murayama et al. |
| 2008/0073768 A1 | 3/2008 | Shiraishi et al. |
| 2008/0094805 A1 | 4/2008 | Tuominen et al. |
| 2008/0171172 A1 | 7/2008 | Bae et al. |
| 2008/0179602 A1 | 7/2008 | Negley et al. |
| 2008/0192450 A1 | 8/2008 | Tuominen et al. |
| 2008/0196930 A1 | 8/2008 | Tuominen et al. |
| 2008/0202801 A1 | 8/2008 | Tuominen et al. |
| 2008/0231169 A1 | 9/2008 | Hata et al. |
| 2009/0041913 A1 | 2/2009 | Weber et al. |
| 2009/0096041 A1 | 4/2009 | Sakakibara et al. |
| 2009/0101998 A1 | 4/2009 | Yen et al. |
| 2009/0184090 A1 | 7/2009 | Wuchse et al. |
| 2009/0230525 A1 | 9/2009 | Chang Chien et al. |
| 2010/0059877 A1 | 3/2010 | Leib et al. |
| 2010/0093905 A1 | 4/2010 | Elizalde et al. |
| 2010/0157583 A1 | 6/2010 | Nakajima |
| 2010/0200882 A1* | 8/2010 | Kotani ............... C08G 59/3245 257/98 |
| 2010/0207142 A1 | 8/2010 | Chen et al. |
| 2010/0308450 A1 | 12/2010 | Verjus et al. |
| 2012/0126429 A1* | 5/2012 | Do ........................ H01L 21/561 257/777 |
| 2013/0003325 A1 | 1/2013 | Freydl et al. |
| 2015/0048408 A1 | 2/2015 | Nam et al. ...................... 257/99 |
| 2015/0049447 A1* | 2/2015 | Ahn ...................... H05K 3/0052 361/761 |
| 2015/0102486 A1* | 4/2015 | Ahn .................. H01L 23/49513 257/737 |
| 2015/0115310 A1* | 4/2015 | Nam ...................... H01L 23/00 257/99 |
| 2015/0237733 A1 | 8/2015 | Stahr et al. |

FOREIGN PATENT DOCUMENTS

| | | |
|---|---|---|
| JP | 8-18104 | 1/1996 |
| JP | 09-055535 A | 2/1997 |
| JP | 2000-236116 A | 8/2000 |
| JP | 3314757 | 8/2002 |
| JP | 2003-303999 | 10/2003 |
| JP | 2003-309292 A | 10/2003 |
| JP | 2004-119981 | 4/2004 |
| JP | 2007-036132 | 2/2007 |
| JP | 2007-134494 | 5/2007 |
| JP | 2009-021264 | 1/2009 |

(56) References Cited

FOREIGN PATENT DOCUMENTS

| KR | 10-2005-0014769 | | 2/2005 | |
|---|---|---|---|---|
| KR | 10-0593943 | B1 | 6/2006 | |
| KR | 10-0616692 | B1 | 8/2006 | |
| KR | 100714749 | B1 | 4/2007 | |
| KR | 100741516 | | 7/2007 | |
| KR | 100759016 | B1 | 9/2007 | |
| KR | 1020070106624 | | 11/2007 | |
| KR | 1020090006790 | | 1/2009 | |
| KR | 1020090117004 | | 11/2009 | |
| KR | 1020090119862 | | 11/2009 | |
| KR | 1020100016737 | | 2/2010 | |
| KR | 1020110011537 | | 2/2011 | |
| KR | 10-2001-0115506 | | 10/2011 | |
| KR | 10-2011-0109650 | | 10/2011 | ............ H01L 33/62 |
| KR | 10-1086014 | B1 | 11/2011 | |
| KR | 1020130066106 | A | 6/2013 | |
| KR | 10-1306247 | | 9/2013 | |
| KR | 10-2014-0018771 | | 2/2014 | ............ H01L 33/48 |
| WO | WO 02/01633 | A1 | 1/2002 | |
| WO | WO 02/45463 | A2 | 6/2002 | |
| WO | WO 2005/086532 | A2 | 9/2005 | |
| WO | WO 2005/102911 | A1 | 11/2005 | |
| WO | WO 2006/028312 | | 3/2006 | |
| WO | WO 2006/061792 | A2 | 6/2006 | |
| WO | WO 2007/117198 | A1 | 10/2007 | |
| WO | WO 2008/091837 | A2 | 7/2008 | |
| WO | WO 2011/113073 | A1 | 9/2011 | |
| WO | WO 2011/127503 | A1 | 10/2011 | |

OTHER PUBLICATIONS

Korean Intellectual Property Office Office Action—Notification of Grounds for Rejection for Application No. 10-2014-0057317, dated Apr. 17, 2015, 3 pages (English translation).
Kopola et al., *MEMS Sensor Packaging Using LTCC Substrate Technology*, Proceedings of SPIE, vol. 4592, 2001, pp. 148-158.
Mahajan et al., *Emerging Directions for Packaging Technologies*, Intel Technology Journal, vol. 6, Issue 2, May 16, 2002, 16 pages.
Prismark Partners LLC, *Technology Forecast and Impact Analysis of PCB Embedded Components*, Prismark Discovery Series, Mar. 2007, 16 pages.
Towle et al., *Bumpless Build-Up Layer Packaging*, Proceedings ASME Int. Mech. Eng. Congress and Exposition (IMECE) New York, Nov. 11-16, 2001, 7 pages.
Wolffenbuttel, *Microsystems for Multi-Sensory Data-Acquisition*, IEEE International Symposium on Industrial Electronics, 1997, pp. 146-151.

* cited by examiner

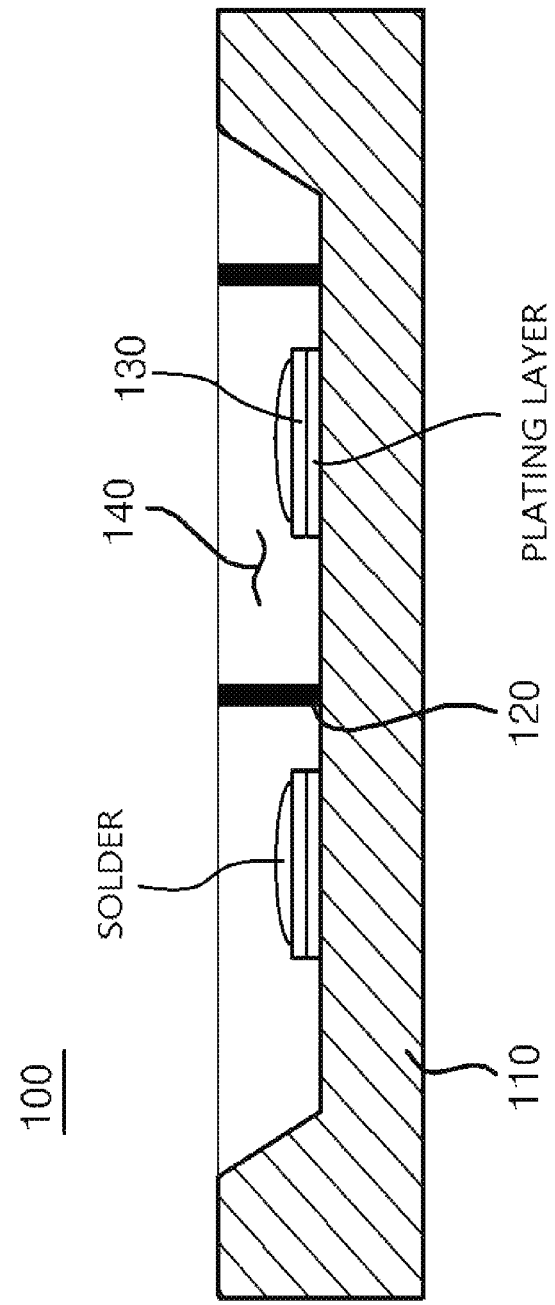

SUBSTRATE FOR MOUNTING A CHIP AND CHIP PACKAGE USING THE SUBSTRATE

BACKGROUND

1. Technical Field

The present invention relates to a substrate for mounting a chip thereon and, more particularly, to a substrate structure for mounting a plurality of chips within a cavity.

2. Description of Related Art

In general, an LED (Light Emitting Diode), which is a semiconductor light emitting diode, draws attention in a variety fields as an environment-friendly light source that does not induce pollution. In recent years, the use range of an LED is expanded to different fields such as indoor/outdoor illumination lights, motor vehicle headlights, backlight units (BLU) of display devices, and so forth. Thus, the LED is required to have high light efficiency and superior heat dissipation characteristics. In order to obtain a high-efficiency LED, the material or structure of the LED needs to be improved first. In addition, it is necessary to improve the structure of an LED package and the material used in the LED package.

In the following descriptions, various kinds of light-emitting chips including LEDs will be referred to as an "optical element chips". A state in which the optical element chips are mounted on a substrate will be referred to as a "chip package". In a conventional optical element package, substrates, e.g., aluminum substrates or copper substrates are electrically insulated by a plurality of insulation layers which penetrate the substrates in an up-down direction. One-side terminals, e.g., anode terminals, of optical elements disposed on the substrates are electrically connected to the substrate of the relevant row by wires or the like. The other-side terminals, e.g., cathode terminals, of the optical elements are electrically connected by wires or the like to the substrate of the adjoining row existing beyond a vertical insulation layer. Furthermore, in order to enhance the reflection efficiency of the light reflected from the optical elements, a cavity in the form of a narrow-bottom/wide-top recess is formed across two rows of substrates which adjoin each other with a vertical insulation layer interposed therebetween. The optical elements and the wires electrically connected thereto are accommodated within the cavity.

However, in this configuration, a single chip is mounted in the central portion of the cavity. In the case of a package in which a single chip is mounted in the central portion of the cavity, if different packages are connected to one another, the overall connection becomes parallel connection. Therefore, in order to realize a backlight unit having a predetermined output power, the amount of an electric current supplied to the backlight unit needs to be increased depending on the number of packages connected to one another. This poses a problem in that the power consumption becomes larger.

SUMMARY

It is an object of the present invention to provide a chip-mounting substrate structure capable of reducing the amount of an electric current which is supplied in order to realize a backlight unit having a predetermined output power.

More specifically, it is an object of the present invention to provide a substrate structure capable of reducing power consumption by realizing a structure in which a plurality of optical element chips can be mounted within a single substrate.

In accordance with one aspect of the present invention, there is provided a chip-mounting substrate, including: a plurality of conductive portions configured to apply voltages to at least two or more chips to be mounted; a plurality of insulation portions formed between the conductive portions and configured to electrically isolate the conductive portions; and a cavity formed in a region which includes at least three or more of the conductive portions and at least two or more of the insulation portions and depressed inward to form a space in which the chips are mounted.

The conductive portions which adjoin each other with each of the insulation portions interposed therebetween may be applied with voltages of opposite polarities.

The chips mounted on the same one of the conductive portions within the cavity may be electrically connected in parallel, and the chips mounted on different conductive portions within the cavity may be electrically connected in a serial relationship.

The chips may not be mounted on one of the conductive portions disposed at one end, among at least three or more of the conductive portions existing within the cavity, and one of the conductive portions not mounted with the chips may be electrically connected to electrode portions of the chips mounted on the adjoining one of the conductive portions.

Each of the insulation portions may be bonded to each of the conductive portions through an anodizing layer formed on at least one surface of each of the conductive portions, so as to electrically isolate the conductive portions.

The substrate may further include: bumps formed at a predetermined height within the cavity on surfaces of the conductive portions isolated by the insulation portions, the bumps bonded to electrode portions formed in the chips.

The electrode portions may be formed on one surface of each of the chips which face the surfaces of the conductive portions, and each of the bumps may be bonded to the electrode portions formed on one surface of each of the chips.

The substrate may further include: solders formed on surfaces of the bumps in order to solder the electrode portions and the bumps.

The substrate may further include: recess portions formed at a predetermined depth within the cavity, wherein the bumps may be formed at a predetermined height on the surfaces of the conductive portions in which the recess portions are formed, the bumps bonded to electrode portions formed in the chips.

The substrate may further include: plating layers formed at a predetermined height within the cavity on the surfaces of the conductive portions isolated by the insulation portions, the plating layers configured to bond the bumps and the conductive portions.

Through-holes extending through the substrate may be formed at points where cutting lines of the substrate intersects the insulation portions when an uncut chip-mounting plate is diced into unit chip-mounting substrates.

In accordance with another aspect of the present invention, there is provided an uncut chip-mounting plate, including: a plurality of conductive portions configured to apply voltages to at least two or more chips which are mounted on each of unit chip-mounting substrates defined on the uncut chip-mounting plate; a plurality of insulation portions formed between the conductive portions in each of the unit chip-mounting substrates and configured to electrically isolate the conductive portions; and a cavity formed in a region of each of the unit chip-mounting substrates which includes at least three or more of the conductive portions and at least two or more of the insulation portions and depressed inward to form a space in which the chips are mounted.

In accordance with a further aspect of the present invention, there is provided a chip package, including: at least two or more chips; a plurality of conductive portions configured to apply voltages to the chips; a plurality of insulation portions formed between the conductive portions and configured to electrically isolate the conductive portions; and a cavity formed in a region which includes at least three or more of the conductive portions and at least two or more of the insulation portions and depressed inward to form a space in which the chips are mounted, wherein the chips are mounted on the conductive portions and are applied with voltages of opposite polarities from the conductive portions.

According to the present invention, it is possible to connect a plurality of optical element chips in a serial/parallel connection structure by realizing a structure in which the optical element chips are mounted within a single substrate. Therefore, as compared with a case where the optical element chips are parallel-connected, it is possible to reduce the amount of an electric current supplied and to ultimately reduce the power consumption.

BRIEF DESCRIPTION OF THE DRAWINGS

FIG. 7 is another sectional view illustrating the chip-mounting substrate.

DETAILED DESCRIPTION OF THE PREFERRED EMBODIMENTS

The following disclosure merely illustrates the principle of the invention. While not explicitly described or illustrated in the subject specification, it may be possible to invent different devices which realize the principle of the invention and which fall within the conception and scope of the invention. Furthermore, all the conditional terms and embodiments disclosed herein are essentially intended to facilitate understanding of the concept of the invention. It is to be understood that the embodiments and states specifically described herein are not limitative.

The above objects, features and advantages will become more apparent from the following detailed descriptions given in conjunction with the accompanying drawings. Thus, a person having an ordinary knowledge in the technical field to which the invention pertains will be able to easily carry out the technical concept of the invention.

In describing the invention, if it is determined that the detailed descriptions on the prior art related to the invention may unnecessarily make obscure the spirit of the invention, the descriptions will be omitted. Hereinafter, a preferred embodiment of a chip-mounting substrate containing a heat dissipating material will be described in detail with reference to the accompanying drawings.

Figure 1:
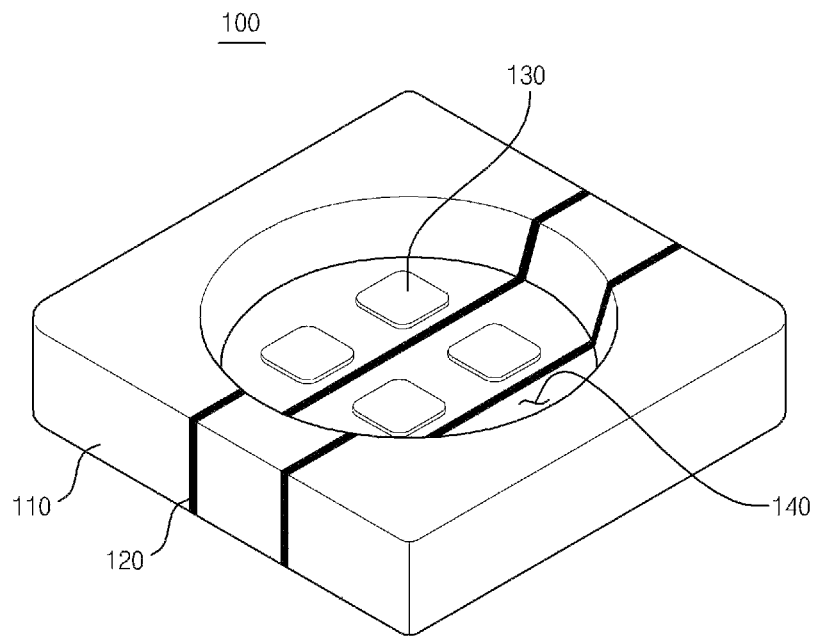
FIG. 1 is a perspective view illustrating a chip-mounting substrate according to one embodiment of the present invention.

FIG. 1 is a view illustrating a chip-mounting substrate according to one embodiment of the present invention.

Referring to FIG. 1, the chip-mounting substrate according to the present embodiment includes conductive portions 110, insulation portions 120 and a cavity.

In the present embodiment, the conductive portions 110 apply voltages to chips 200 mounted. That is to say, the conductive portions 110 are made of a conductive material in order to apply voltages to the chips 200. The lower portions of the conductive portions 110 are bonded to a substrate 100 having electrodes formed thereon and are applied with voltages from the outside. In the present embodiment, the conductive portions 110 may be formed using an aluminum plate.

The insulation portions 120 electrically isolate the conductive portions 110 in order to apply voltages to the respective electrode portions of the chips 200. That is to say, the insulation portions 120 electrically isolate the conductive portions 110 in order to apply voltages, i.e., a positive voltage and a negative voltage, to the chips 200. The respective conductive portions 110 thus isolated are applied with a positive voltage and a negative voltage from the outside.

Furthermore, in the present embodiment, the conductive portions 110 may be formed in a plural number in order to apply voltages to at least two or more chips. That is to say, referring to FIG. 1, three conductive portions 110 may be bonded in one unit substrate.

Moreover, in the present embodiment, the insulation portions 120 are formed in a plural number in order to isolate the conductive portions 110 to apply different voltages to at least two or more chips. That is to say, referring to FIG. 1, in one unit substrate, two insulation portions 120 may be formed between three conductive portions 110.

Accordingly, the chips are mounted on the two conductive portions 110 among the three conductive portions 110 isolated by the two insulation portions 120, except one of the two conductive portions 100 positioned at the opposite ends. In this case, voltages of opposite polarities are applied to the conductive portions 110 which adjoin one another with the insulation portions 120 interposed therebetween. In the present embodiment, the voltages of the same polarity are applied to the two conductive portions 110 positioned at the opposite ends. The conductive portion 110 not mounted with the chips may be electrically connected to the electrode portions of the chips mounted on the adjoining conductive portion 110.

That is to say, the chips mounted on the same conductive portion 110 are electrically connected in parallel with each other. The chips mounted on different conductive portions 110 are electrically connected in a serial relationship with each other. Thus, a serial/parallel connection structure of the chips is formed on the chip-mounting substrate.

In the present embodiment, a cavity 140 depressed inward of the conductive portions 110 is formed in the chip-mounting substrate in order to form a space in which the chips 200 are mounted. That is to say, referring to FIG. 2, the surface of the substrate on which the chips 200 are mounted is formed in a shape depressed from the external surface. In other words, the substrate has such a shape that an outer wall is formed around a region where the chips 200 are mounted. In order to reflect the light emitted from the chips 200, the cavity 140 may be formed in a narrow-bottom/wide-top shape. The outer wall of the cavity 140 may be inclined with respect to the central region of the substrate so as to extend upward and outward.

That is to say, in the present embodiment, the chips are mounted on the conductive portions 110 in the space defined within the cavity 140. After the chips are mounted, the cavity 140 is sealed by a lens or the like, thereby manufacturing a chip package.

In the present embodiment, the insulation portions 120 may be formed of insulation films made of a synthetic resin. In this case, the conductive portions 110 and the insulation portions 120 are bonded using a liquid adhesive agent or the like. In order to increase the bonding force, the bonding may be performed by interposing synthetic-resin-made bonding films between the conductive portions 110. In order to further increase the bonding force, the bonding process may be performed within a high-temperature/high-pressure chamber capable of maintaining a temperature higher than a room temperature and a pressure higher than an atmospheric pressure. In addition, the boding process may be performed after the bonding surfaces are roughened by a mechanical or chemical method.

That is to say, in the present embodiment, at least one surface of the conductive portions 110, preferably the surface of each of the conductive portions 110 facing each of the insulation portions 120, may be subjected to anodizing. Then, each of the insulation portions 120 may be bonded to the anodized surface of each of the conductive portions 110. In other words, if the conductive portions 110 are made of aluminum, the respective bonding surfaces may be anodized prior to the bonding process in order to increase the bonding force. The anodized surfaces may be roughened as mentioned above.

In the present embodiment, if the conductive portions 110 are made of aluminum, each of the insulation portions 120 may be bonded by anodizing the surface of each of the conductive portions 110 facing the insulation portions 120.

In the present embodiment, the chip-mounting substrate may further include bumps 130. In the present embodiment, the bumps 130 are formed at a predetermined height within the cavity 140 on the surfaces of the respective conductive portions isolated by the insulation portions. The bumps 130 are bonded to the electrode portions formed in the chips.

Figure 2:
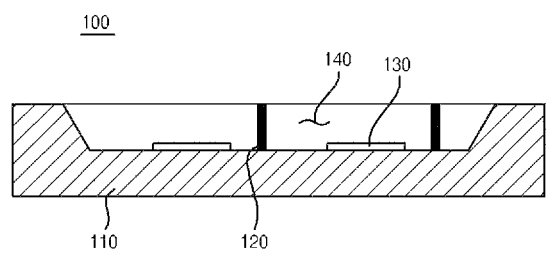
FIG. 2 is a sectional view illustrating the chip-mounting substrate according to one embodiment of the present invention.

More specifically, the bumps 130 are formed at a predetermined height on the surfaces of the respective conductive portions 110 isolated by the insulation portions 120 and are bonded to the electrode portions formed in the chips 200. That is to say, the bumps 130 are formed on the surfaces of the conductive portions 110. Referring to FIG. 2, the bumps 130 are formed on the surfaces of the conductive portions 110 corresponding to the central portion of the cavity 140.

The surfaces of the conductive portions 110 corresponding to the central portion of the cavity 140 are isolated by the insulation portions 120. The bumps 130 are formed at a predetermined height on the surfaces of the conductive portions 110 isolated by the insulation portions 120. The bumps 130 are preferably made of a conductive material so that the voltages applied to the conductive portions 110 can be applied to the electrode portions of the chips 200 mounted on the bumps 130. The bumps 130 may be gold bumps made of gold.

That is to say, the electrode portions of the chips 200 are formed on one surface of each of the chips 200 facing the surface of each of the conductive portions 110 in which the cavity 140 is formed. Each of the bumps 130 is bonded to the electrode portions formed on one surface of each of the chips 200.

Figure 3:
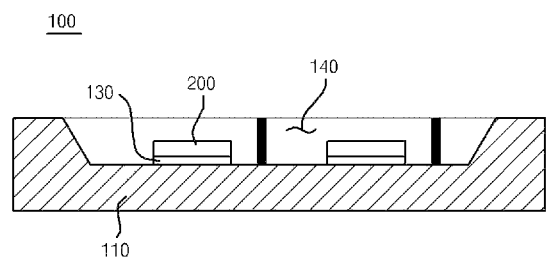
FIG. 3 is a sectional view illustrating an example in which chips are mounted on the chip-mounting substrate according to one embodiment of the present invention.

FIG. 3 is a view illustrating a chip package in which the chips 200 are mounted on the chip-mounting substrate according to the embodiment described above. In FIG. 3, the electrode portions of the chips 200 are formed on the bottom surfaces of the chips 200. If the chips 200 are mounted on the substrate, the electrode portions of the chips 200 make contact with the bumps 130 formed in the substrate.

Accordingly, in the present embodiment, the bumps 130 are formed in the regions (electrode regions) of the aluminum substrate in which the chips 200 are to be positioned. The bumps 130 may be formed using a wire bonding device. In another embodiment, bumps may be previously formed in the electrode portions of chips. Alternatively, the electrode portions of chips may be formed at such a thickness that the electrode portions can serve as bumps. In this case, the chips may be directly bonded to an aluminum substrate.

Referring again to FIG. 3, the chip-mounting substrate may further include solders which are formed on the surfaces of the bumps 130 in order to solder the electrode portions and the bumps 130. The plating layers formed in the electrode regions of UV chips and the bumps 130 may be bonded by a thermo-sonic bonding method. Alternatively, solders may be formed on the surfaces of the bumps 130 so that the chips and the bumps 130 can be bonded by soldering.

Due to the structure of flip chips 200, the space where UV rays are outputted is the region other than the lower portions of the chips 200. Thus, the region where the bumps 130 and the electrode portions are bonded during the mounting process can be clearly distinguished from the region where the UV rays are irradiated. It is therefore possible to increase the UV output power.

In addition, it is possible to independently form a sealing portion which will be described later. This makes it possible to accurately control the amount of a material when forming the sealing portion. Detailed descriptions on this point will be described later.

The chip-mounting substrate according to the present embodiment may further include plating layers. The plating layers are formed on the surfaces of the conductive portions 110 between the bumps 130 and the conductive portions 110. Since there is a possibility of reduction of the reliability in bonding the bumps 130 to the surfaces of the conductive portions 110, the plating layers are selectively formed on the surfaces of the conductive portions 110. This makes it possible to strongly bond the bumps 130.

Next, an uncut chip-mounting plate 10 according to one embodiment of the present invention will be described with reference to FIG. 5.

Figure 5:
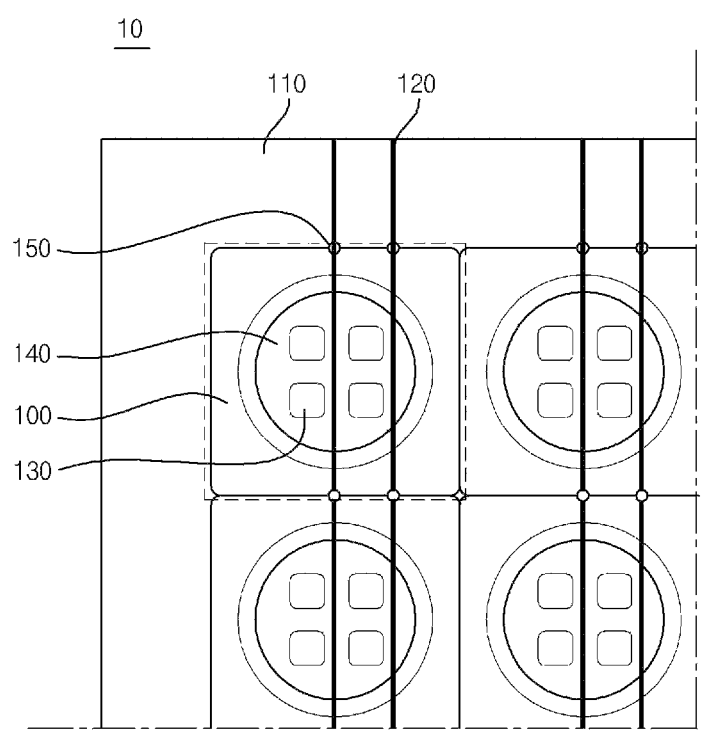
FIG. 5 is a perspective view illustrating an uncut chip-mounting plate according to one embodiment of the present invention.
Figure 6:
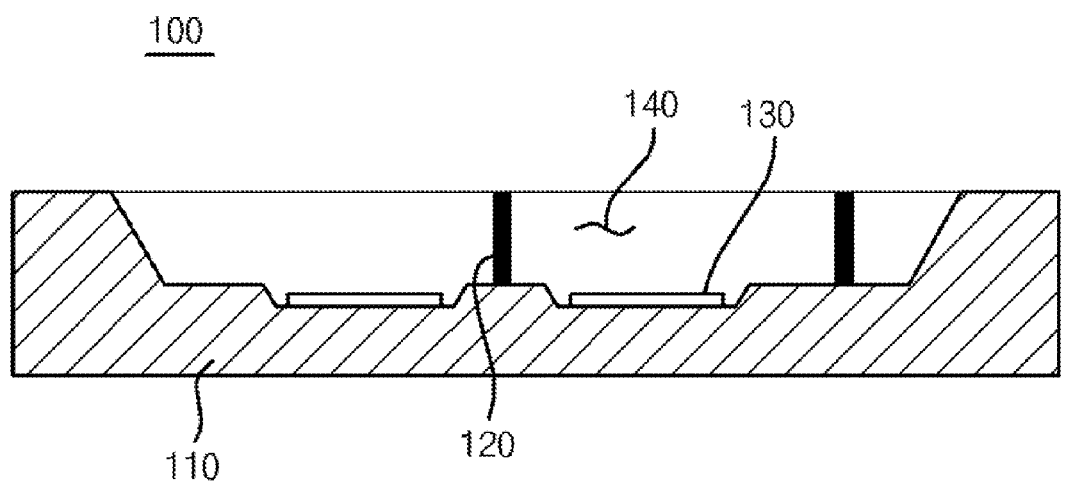
FIG. 6 is another sectional view illustrating the chip-mounting substrate.

Referring to FIG. 5, the uncut chip-mounting plate 10 according to the present embodiment includes conductive portions 110, insulation portions 120 and cavities 140.

Figure 4:
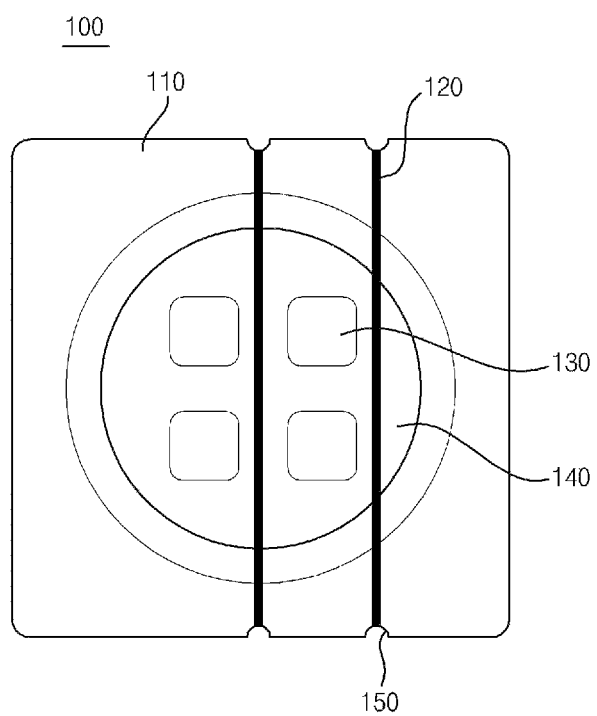
FIG. 4 is a top view illustrating a chip-mounting substrate diced from an uncut chip-mounting plate.

That is to say, the chip-mounting substrate 100 according to the aforementioned embodiment is formed by dicing the uncut chip-mounting plate 10 into unit chip-mounting substrates as illustrated in FIG. 4. Thus, the conductive portions 110, the insulation portions 120 and the cavities 140 of the uncut chip-mounting plate 10 perform the functions described in the aforementioned embodiment.

Accordingly, the conductive portions 110 are laminated in one direction so as to constitute the uncut chip-mounting plate 10. The insulation portions 120 are alternately laminated with the conductive portions 110 so as to electrically isolate the conductive portions 110.

The cavities 140 are formed at a predetermined depth in the regions including the insulation portions 120 in a corresponding relationship with the unit chip-mounting substrates 100 defined on the upper surface of the uncut chip-mounting plate 10. Duplicate descriptions on the conductive portions 110, the insulation portions 120 and the cavities 140 are omitted.

The uncut chip-mounting plate 10 according to the present embodiment may further include through-holes 150. More specifically, as illustrated in FIG. 5, the uncut chip-mounting plate 10 further includes through-holes 150 extending through the uncut chip-mounting plate 10 at the points where the cutting lines of the unit chip-mounting substrates intersect the insulation portions 120.

The through-holes 150 are formed prior to dicing the uncut chip-mounting plate 10. No additional cutting process is required to be performed in the regions where the through-holes 150 are formed. The aluminum conductive portions and the insulation portions are simultaneously cut in the sawing or dicing process. By forming the through-holes 150, it is possible to prevent a problem that burrs are generated in the bonding regions of the insulation portions and the aluminum conductive portions and are stretched to the adjoining conductive portions, consequently breaking electric insulation between the conductive portions.

By dicing the uncut chip-mounting plate 10 illustrated in FIG. 5, it is possible to manufacture a unit chip-mounting substrate including the through-holes 150 as illustrated in FIG. 4.

According to the present invention described above, it is possible to realize a structure in which a plurality of optical element chips is mounted within a single substrate. This makes it possible to connect the chips in a serial/parallel connection structure. Therefore, as compared with a case where the optical element chips are parallel-connected, it is possible to reduce the amount of an electric current supplied and to ultimately reduce the power consumption.

While not illustrated in the drawings, when optical element chips are packaged using the chip-mounting substrate according to the aforementioned embodiment, the optical element chips are mounted on a plurality of conductive portions and are applied with voltages of opposite polarities from the respective conductive portions.

In this case, the application of voltages can be realized by wire bonding or bonding to the conductive portions. It goes without saying that the method of applying voltages may be differently changed depending on the structure of the chips mounted.

The forgoing descriptions are mere illustration of the technical concept of the present invention. A person having an ordinary knowledge in the technical field to which the invention pertains will be able to make modifications, changes and substitutions without departing from the essential features of the invention.

Accordingly, the embodiments and the accompanying drawings disclosed herein are not intended to limit the technical concept of the present invention but are intended to describe the present invention. The technical concept of the present invention shall not be limited by the embodiments and the accompanying drawings. The protection scope of the present invention shall be construed on the basis of the appended claims. All the technical concepts which are equivalent in scope to the claims shall be construed to fall within the scope of the present invention.

What is claimed is:

1. A chip-mounting substrate, comprising:
   a plurality of conductive portions configured to apply voltages to at least two or more chips to be mounted;
   a plurality of insulation portions formed between the conductive portions and configured to electrically isolate the conductive portions;
   a cavity formed in a region which includes at least three or more of the conductive portions and at least two or more of the insulation portions and depressed inward to form a space in which the chips are mounted; and
   through-holes located on cutting lines of the chip-mounting substrate so as to penetrate and divide the insulation portions, wherein the cutting lines are lines along which the chip-mounting substrate is diced into unit chip-mounting substrates.

2. The chip-mounting substrate of claim 1, wherein the conductive portions which adjoin each other with each of the insulation portions interposed therebetween are applied with voltages of opposite polarities.

3. The chip-mounting substrate of claim 2, wherein the chips mounted on a common one of the conductive portions within the cavity are electrically connected in parallel, and the chips mounted on different ones of the conductive portions within the cavity are electrically connected in a serial relationship.

4. The chip-mounting substrate of claim 2, wherein the chips are not mounted on one of the conductive portions disposed at one end, among the at least three or more of the conductive portions existing within the cavity, and the one of the conductive portions not mounted with the chips is electrically connected to electrode portions of the chips mounted on an adjoining one of the conductive portions.

5. The chip-mounting substrate of claim 1, wherein each of the insulation portions is bonded to each of the conductive portions through an anodizing layer formed on at least one surface of each of the conductive portions, so as to electrically isolate the conductive portions.

6. The chip-mounting substrate of claim 1, further comprising:
   bumps formed at a predetermined height within the cavity on surfaces of the conductive portions isolated by the insulation portions, the bumps bonded to electrode portions formed in the chips.

7. The chip-mounting substrate of claim 6, wherein the electrode portions are formed on one surface of each of the chips which face the surfaces of the conductive portions, and each of the bumps is bonded to the electrode portions formed on one surface of each of the chips.

8. The chip-mounting substrate of claim 6, further comprising:
   solders formed on surfaces of the bumps in order to solder the electrode portions and the bumps.

9. The chip-mounting substrate of claim 6, further comprising:
   recess portions formed at a predetermined depth within the cavity,
   wherein the bumps are formed at a predetermined height on the surfaces of the conductive portions in which the recess portions are formed, the bumps bonded to electrode portions formed in the chips.

10. The chip-mounting substrate of claim 6, further comprising:
    plating layers formed at a predetermined height within the cavity on the surfaces of the conductive portions isolated by the insulation portions, the plating layers configured to bond the bumps and the conductive portions.

11. An uncut chip-mounting plate, comprising:
- a plurality of conductive portions configured to apply voltages to at least two or more chips which are mounted on each of unit chip-mounting substrates defined on the uncut chip-mounting plate;
- a plurality of insulation portions formed between the conductive portions in each of the unit chip-mounting substrates and configured to electrically isolate the conductive portions;
- a cavity formed in a region of each of the unit chip-mounting substrates which includes at least three or more of the conductive portions and at least two or more of the insulation portions and depressed inward to form a space in which the chips are mounted; and
- through-holes located on cutting lines of the uncut chip-mounting plate so as to penetrate and divide the insulation portions, wherein the cutting lines are lines along which the uncut chip-mounting plate is diced into unit chip-mounting substrates.

12. A chip package, comprising:
- at least two or more chips;
- a plurality of conductive portions configured to apply voltages to the chips;
- a plurality of insulation portions formed between the conductive portions and configured to electrically isolate the conductive portions; and
- a cavity formed in a region which includes at least three or more of the conductive portions and at least two or more of the insulation portions and depressed inward to form a space in which the chips are mounted,
- wherein the chips are mounted on the conductive portions and are applied with voltages of opposite polarities from the conductive portions; and
- through-holes are located on cutting lines of a chip-mounting plate so as to penetrate and divide the insulation portions, wherein the cutting lines are lines along which the chip-mounting plate is diced into unit chip-mounting substrates.

* * * * *